US012651154B2

(12) United States Patent
Kale

(10) Patent No.: US 12,651,154 B2
(45) Date of Patent: Jun. 9, 2026

(54) OPTIMIZED SENSOR FUSION IN DEEP LEARNING ACCELERATOR WITH INTEGRATED RANDOM ACCESS MEMORY

(71) Applicant: Micron Technology, Inc., Boise, ID (US)

(72) Inventor: Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 920 days.

(21) Appl. No.: 16/987,090

(22) Filed: Aug. 6, 2020

(65) Prior Publication Data

US 2022/0044107 A1     Feb. 10, 2022

(51) Int. Cl.
| | |
|---|---|
| *G06N 3/08* | (2023.01) |
| *G06F 3/06* | (2006.01) |
| *G06F 13/16* | (2006.01) |
| *G06F 15/16* | (2006.01) |
| *G06N 3/04* | (2023.01) |
| *H10W 90/00* | (2026.01) |
| *H10W 90/20* | (2026.01) |

(52) U.S. Cl.
CPC ............. *G06N 3/08* (2013.01); *G06F 3/0604* (2013.01); *G06F 3/0659* (2013.01); *G06F 3/0679* (2013.01); *G06F 13/1668* (2013.01); *G06F 15/16* (2013.01); *G06N 3/04* (2013.01); *H10W 90/00* (2026.01); *H10W 90/291* (2026.01); *H10W 90/297* (2026.01)

(58) Field of Classification Search
CPC .......... G06N 3/08; G06N 3/04; G06F 3/0604;
G06F 3/0659; G06F 3/0679; G06F 13/1668; G06F 15/16; H01L 25/0657; H01L 2225/06541; H01L 2225/06582
See application file for complete search history.

(56) References Cited

U.S. PATENT DOCUMENTS

| | | | |
|---|---|---|---|
| 10,460,258 B2 | 10/2019 | Sugaya | |
| 10,671,068 B1 * | 6/2020 | Xu | .................. G05D 1/0212 |
| 10,678,479 B1 | 6/2020 | Diamant et al. | |

(Continued)

FOREIGN PATENT DOCUMENTS

| | | |
|---|---|---|
| CN | 110687816 | 1/2020 |
| WO | 2020122985 | 6/2020 |

OTHER PUBLICATIONS

LeCun, Yann, Yoshua Bengio, and Geoffrey Hinton. "Deep learning." nature 521, No. 7553 (2015): 436-444. (Year: 2015).*

(Continued)

*Primary Examiner* — Casey R. Garner
(74) *Attorney, Agent, or Firm* — Greenberg Traurig

(57) ABSTRACT

Systems, devices, and methods related to a Deep Learning Accelerator and memory are described. For example, an integrated circuit device may be configured to execute instructions with matrix operands and configured with random access memory. The random access memory is configured to store a plurality of inputs from a plurality of sensors respective, parameters of an Artificial Neural Network, and instructions executable by the Deep Learning Accelerator to perform matrix computation to generate outputs of the Artificial Neural Network, including first outputs generated using the sensors separately and a second output generated using a combination of the sensors.

20 Claims, 9 Drawing Sheets

(56) References Cited

U.S. PATENT DOCUMENTS

| | | | |
|---|---|---|---|
| 10,964,676 B2 | 3/2021 | Yazdani | |
| 11,144,291 B1 | 10/2021 | Zheng et al. | |
| 11,204,747 B1 | 12/2021 | Zejda et al. | |
| 11,468,984 B2 | 10/2022 | Schneider et al. | |
| 11,720,417 B2 | 8/2023 | Kale | |
| 12,327,175 B2 | 6/2025 | Kale | |
| 2003/0187618 A1* | 10/2003 | Inda | G16H 40/67 |
| | | | 702/188 |
| 2005/0047670 A1 | 3/2005 | Qian et al. | |
| 2008/0177683 A1 | 7/2008 | No et al. | |
| 2010/0076915 A1 | 3/2010 | Xu et al. | |
| 2011/0219150 A1 | 9/2011 | Piccirillo et al. | |
| 2016/0342905 A1 | 11/2016 | Ghose et al. | |
| 2017/0169208 A1 | 6/2017 | Jantz et al. | |
| 2017/0316312 A1 | 11/2017 | Goyal et al. | |
| 2017/0323201 A1 | 11/2017 | Sutskever et al. | |
| 2018/0136912 A1 | 5/2018 | Venkataramani et al. | |
| 2018/0285719 A1 | 10/2018 | Baum et al. | |
| 2018/0285767 A1 | 10/2018 | Chew | |
| 2018/0293513 A1 | 10/2018 | Sugaya | |
| 2018/0307976 A1 | 10/2018 | Fang et al. | |
| 2018/0314671 A1 | 11/2018 | Zhang et al. | |
| 2018/0314945 A1 | 11/2018 | Breternitz et al. | |
| 2019/0012116 A1 | 1/2019 | Gutala et al. | |
| 2019/0034803 A1 | 1/2019 | Gotou | |
| 2019/0042224 A1 | 2/2019 | Caballero De Gea et al. | |
| 2019/0042915 A1 | 2/2019 | Akin et al. | |
| 2019/0042921 A1 | 2/2019 | Zamora Esquivel et al. | |
| 2019/0050733 A1 | 2/2019 | Bopardikar et al. | |
| 2019/0079768 A1 | 3/2019 | Heinecke et al. | |
| 2019/0079801 A1 | 3/2019 | Lyuh et al. | |
| 2019/0171941 A1 | 6/2019 | Quach et al. | |
| 2019/0180170 A1 | 6/2019 | Huang et al. | |
| 2019/0220742 A1 | 7/2019 | Kuo et al. | |
| 2019/0236049 A1 | 8/2019 | Vantrease et al. | |
| 2019/0286972 A1 | 9/2019 | El Husseini et al. | |
| 2019/0286973 A1 | 9/2019 | Kovvuri et al. | |
| 2020/0012924 A1 | 1/2020 | Ma et al. | |
| 2020/0019844 A1 | 1/2020 | Lewis et al. | |
| 2020/0026498 A1 | 1/2020 | Sumbul et al. | |
| 2020/0074202 A1 | 3/2020 | Kim et al. | |
| 2020/0133273 A1 | 4/2020 | Skorheim et al. | |
| 2020/0175363 A1 | 6/2020 | Lin et al. | |
| 2020/0184001 A1 | 6/2020 | Gu et al. | |
| 2020/0210754 A1 | 7/2020 | Lin et al. | |
| 2020/0219015 A1 | 7/2020 | Lee et al. | |
| 2020/0226473 A1 | 7/2020 | Sharma et al. | |
| 2020/0348664 A1 | 11/2020 | Mueller et al. | |
| 2020/0349216 A1 | 11/2020 | Das Sarma | |
| 2020/0349362 A1 | 11/2020 | Maloney | |
| 2020/0380361 A1 | 12/2020 | Tanach | |
| 2021/0020627 A1 | 1/2021 | Farooq et al. | |
| 2021/0150685 A1 | 5/2021 | Chen et al. | |
| 2021/0182654 A1* | 6/2021 | Markram | G06F 17/18 |
| 2021/0206588 A1 | 7/2021 | Douglas et al. | |
| 2021/0240615 A1 | 8/2021 | Sohn et al. | |
| 2021/0320967 A1 | 10/2021 | Kale et al. | |
| 2022/0043696 A1 | 2/2022 | Kale | |
| 2022/0044101 A1 | 2/2022 | Kale | |
| 2022/0165045 A1 | 5/2022 | Jiang et al. | |
| 2022/0279203 A1 | 9/2022 | Mangan | |
| 2023/0115494 A1* | 4/2023 | Maheshwari | G11C 7/1006 |
| | | | 711/154 |
| 2023/0153587 A1 | 5/2023 | Vogelsang et al. | |
| 2023/0297287 A1 | 9/2023 | Zafar | |

OTHER PUBLICATIONS

En Li, et al. "Edge Intelligence: On-Demand Deep Learning Model Co-Inference with Device-Edge Synergy." The SIGCOMM Workshop on Mobile Edge Communication, Aug. 21-23, 2018.

International Search Report and Written Opinion, PCT/US2021/044292, mailed on Nov. 19, 2021.

International Search Report and Written Opinion, PCT/US2021/044485, mailed on Nov. 25, 2021.

International Search Report and Written Opinion, PCT/US2021/042703, mailed on Nov. 9, 2021.

International Search Report and Written Opinion, PCT/US2021/026005, mailed on Jul. 23, 2021.

Extended European Search Report, EP21784489.3, mailed on Apr. 3, 2024.

Lecun, Yann, et al., "Deep learning." Nature, vol. 521, May 28, 2015.

* cited by examiner

Integrated Circuit Device 101

Deep Learning Accelerator (DLA) 103

Processing Units 111

Control Unit 113

Local Memory 115

Memory Interface 117

Connection 119

Random Access Memory 105

109

Memory Controller Interface 107

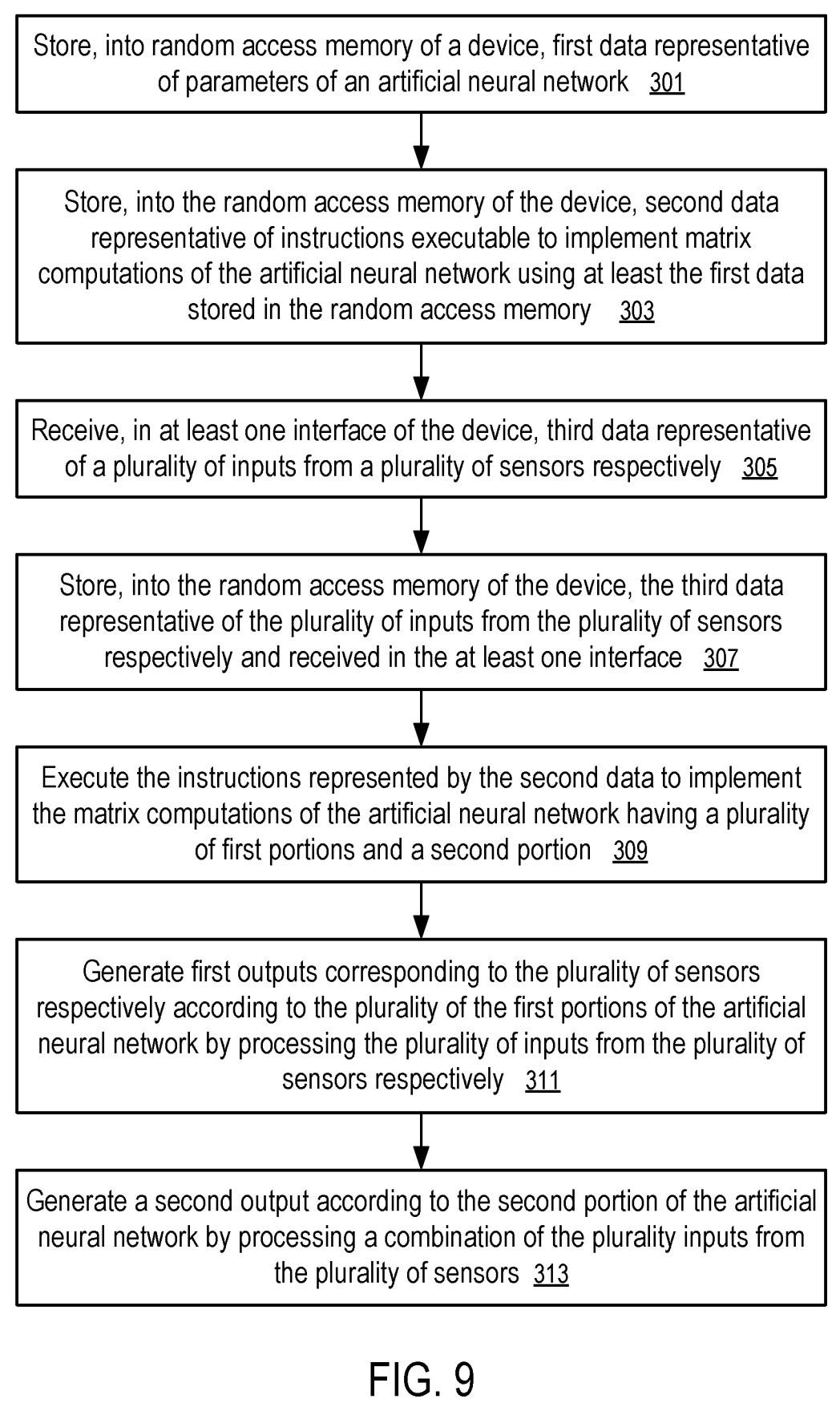

Store, into random access memory of a device, first data representative of parameters of an artificial neural network   301

Store, into the random access memory of the device, second data representative of instructions executable to implement matrix computations of the artificial neural network using at least the first data stored in the random access memory   303

Receive, in at least one interface of the device, third data representative of a plurality of inputs from a plurality of sensors respectively   305

Store, into the random access memory of the device, the third data representative of the plurality of inputs from the plurality of sensors respectively and received in the at least one interface   307

Execute the instructions represented by the second data to implement the matrix computations of the artificial neural network having a plurality of first portions and a second portion   309

Generate first outputs corresponding to the plurality of sensors respectively according to the plurality of the first portions of the artificial neural network by processing the plurality of inputs from the plurality of sensors respectively   311

Generate a second output according to the second portion of the artificial neural network by processing a combination of the plurality inputs from the plurality of sensors   313

FIG. 9

OPTIMIZED SENSOR FUSION IN DEEP LEARNING ACCELERATOR WITH INTEGRATED RANDOM ACCESS MEMORY

TECHNICAL FIELD

At least some embodiments disclosed herein relate to sensor fusion in general and more particularly, but not limited to, sensor fusion implemented via accelerators for Artificial Neural Networks (ANNs), such as ANNs configured through machine learning and/or deep learning.

BACKGROUND

An Artificial Neural Network (ANN) uses a network of neurons to process inputs to the network and to generate outputs from the network.

For example, each neuron in the network receives a set of inputs. Some of the inputs to a neuron may be the outputs of certain neurons in the network; and some of the inputs to a neuron may be the inputs provided to the neural network. The input/output relations among the neurons in the network represent the neuron connectivity in the network.

For example, each neuron can have a bias, an activation function, and a set of synaptic weights for its inputs respectively. The activation function may be in the form of a step function, a linear function, a log-sigmoid function, etc. Different neurons in the network may have different activation functions.

For example, each neuron can generate a weighted sum of its inputs and its bias and then produce an output that is the function of the weighted sum, computed using the activation function of the neuron.

The relations between the input(s) and the output(s) of an ANN in general are defined by an ANN model that includes the data representing the connectivity of the neurons in the network, as well as the bias, activation function, and synaptic weights of each neuron. Based on a given ANN model, a computing device can be configured to compute the output(s) of the network from a given set of inputs to the network.

For example, the inputs to an ANN network may be generated based on camera inputs; and the outputs from the ANN network may be the identification of an item, such as an event or an object.

In general, an ANN may be trained using a supervised method where the parameters in the ANN are adjusted to minimize or reduce the error between known outputs associated with or resulted from respective inputs and computed outputs generated via applying the inputs to the ANN. Examples of supervised learning/training methods include reinforcement learning and learning with error correction.

Alternatively, or in combination, an ANN may be trained using an unsupervised method where the exact outputs resulted from a given set of inputs is not known before the completion of the training. The ANN can be trained to classify an item into a plurality of categories, or data points into clusters.

Multiple training algorithms can be employed for a sophisticated machine learning/training paradigm.

Deep learning uses multiple layers of machine learning to progressively extract features from input data. For example, lower layers can be configured to identify edges in an image; and higher layers can be configured to identify, based on the edges detected using the lower layers, items captured in the image, such as faces, objects, events, etc. Deep learning can be implemented via Artificial Neural Networks (ANNs), such as deep neural networks, deep belief networks, recurrent neural networks, and/or convolutional neural networks.

Deep learning has been applied to many application fields, such as computer vision, speech/audio recognition, natural language processing, machine translation, bioinformatics, drug design, medical image processing, games, etc.

BRIEF DESCRIPTION OF THE DRAWINGS

The embodiments are illustrated by way of example and not limitation in the figures of the accompanying drawings in which like references indicate similar elements.

FIG. 9 shows a method of sensor fusion according to one embodiment.

DETAILED DESCRIPTION

Figure 1:
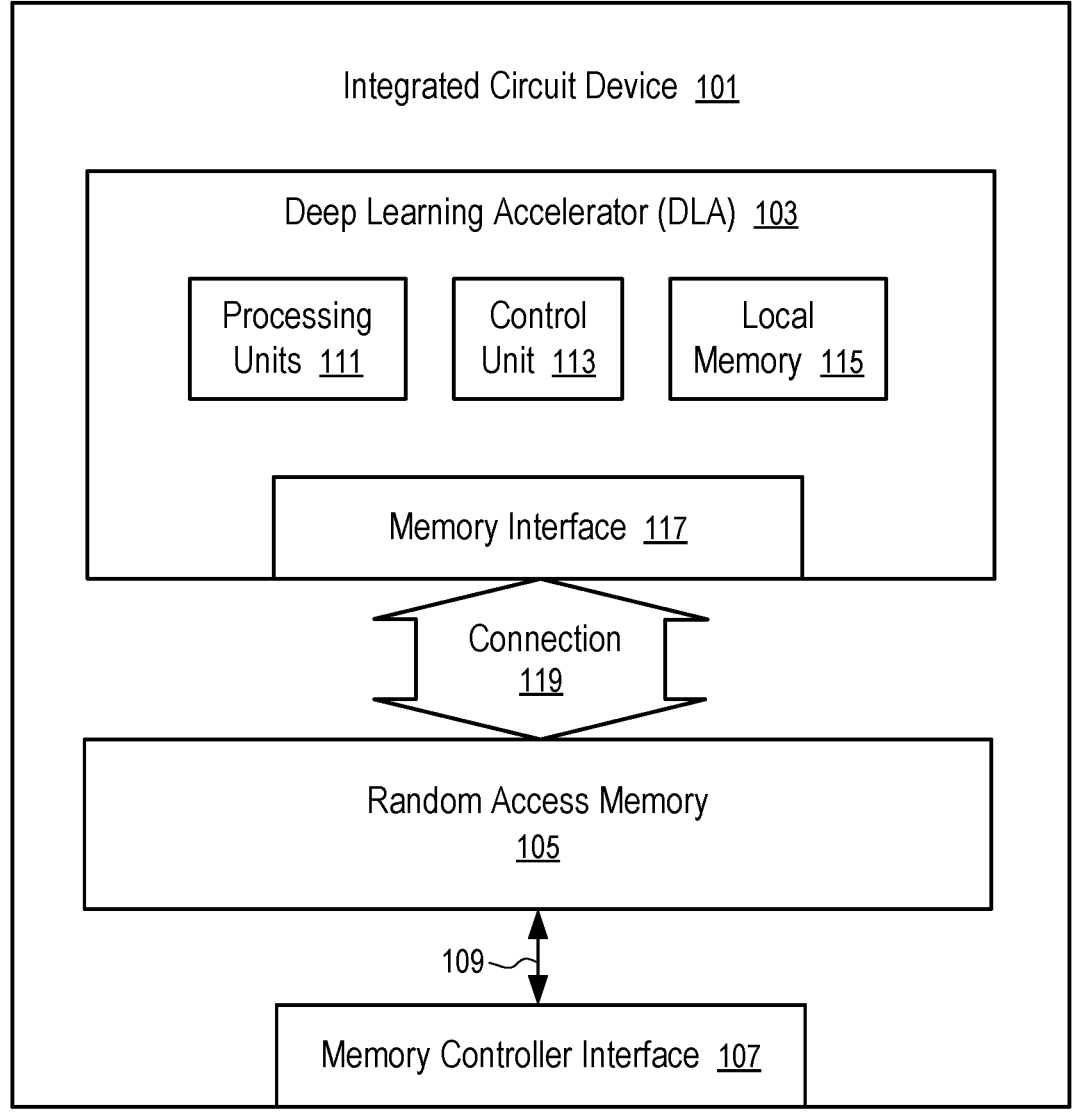
FIG. 1 shows an integrated circuit device having a Deep Learning Accelerator and random access memory configured according to one embodiment.

At least some embodiments disclosed herein provide an integrated circuit configured to perform sensor fusion using Artificial Neural Networks (ANNs) with reduced energy consumption and computation time. The integrated circuit includes a Deep Learning Accelerator (DLA) and random access memory. The random access memory has multiple portions configured to receive sensor data from multiple sensors respectively. The random access memory includes a further portion configured to store instructions for the Deep Learning Accelerator (DLA). The instructions have matrix operands and configured to be executed by the Deep Learning Accelerator (DLA) to implement matrix computations of the Artificial Neural Networks (ANNs). The instructions can be generated by a compiler from descriptions of Artificial Neural Networks (ANNs) to process the sensor data of the multiple sensors. At least one of the Artificial Neural Networks (ANNs) is trained to generate outputs based on the sensor data of more than one of the sensors. The instructions can be optimized by the compiler by reducing or eliminating overlapping processing in the Artificial Neural Networks (ANNs) and/or by coordinating the timing of intermediate results derived separately from different sensors. The sensor fusion results generated from the Artificial Neural Networks (ANNs) combining the input data from multiple sensors can power higher-level intelligent predictions.

The Deep Learning Accelerator (DLA) includes a set of programmable hardware computing logic that is specialized and/or optimized to perform parallel vector and/or matrix calculations, including but not limited to multiplication and accumulation of vectors and/or matrices.

Further, the Deep Learning Accelerator (DLA) can include one or more Arithmetic-Logic Units (ALUs) to perform arithmetic and bitwise operations on integer binary numbers.

The Deep Learning Accelerator (DLA) is programmable via a set of instructions to perform the computations of an Artificial Neural Network (ANN).

The granularity of the Deep Learning Accelerator (DLA) operating on vectors and matrices corresponds to the largest unit of vectors/matrices that can be operated upon during the execution of one instruction by the Deep Learning Accelerator (DLA). During the execution of the instruction for a predefined operation on vector/matrix operands, elements of vector/matrix operands can be operated upon by the Deep Learning Accelerator (DLA) in parallel to reduce execution time and/or energy consumption associated with memory/data access. The operations on vector/matrix operands of the granularity of the Deep Learning Accelerator (DLA) can be used as building blocks to implement computations on vectors/matrices of larger sizes.

The implementation of a typical/practical Artificial Neural Network (ANN) involves vector/matrix operands having sizes that are larger than the operation granularity of the Deep Learning Accelerator (DLA). To implement such an Artificial Neural Network (ANN) using the Deep Learning Accelerator (DLA), computations involving the vector/matrix operands of large sizes can be broken down to the computations of vector/matrix operands of the granularity of the Deep Learning Accelerator (DLA). The Deep Learning Accelerator (DLA) can be programmed via instructions to carry out the computations involving large vector/matrix operands. For example, atomic computation capabilities of the Deep Learning Accelerator (DLA) in manipulating vectors and matrices of the granularity of the Deep Learning Accelerator (DLA) in response to instructions can be programmed to implement computations in an Artificial Neural Network (ANN).

In some implementations, the Deep Learning Accelerator (DLA) lacks some of the logic operation capabilities of a typical Central Processing Unit (CPU). However, the Deep Learning Accelerator (DLA) can be configured with sufficient logic units to process the input data provided to an Artificial Neural Network (ANN) and generate the output of the Artificial Neural Network (ANN) according to a set of instructions generated for the Deep Learning Accelerator (DLA). Thus, the Deep Learning Accelerator (DLA) can perform the computation of an Artificial Neural Network (ANN) with little or no help from a Central Processing Unit (CPU) or another processor. Optionally, a conventional general purpose processor can also be configured as part of the Deep Learning Accelerator (DLA) to perform operations that cannot be implemented efficiently using the vector/matrix processing units of the Deep Learning Accelerator (DLA), and/or that cannot be performed by the vector/matrix processing units of the Deep Learning Accelerator (DLA).

A typical Artificial Neural Network (ANN) can be described/specified in a standard format (e.g., Open Neural Network Exchange (ONNX)). A compiler can be used to convert the description of the Artificial Neural Network (ANN) into a set of instructions for the Deep Learning Accelerator (DLA) to perform calculations of the Artificial Neural Network (ANN). The compiler can optimize the set of instructions to improve the performance of the Deep Learning Accelerator (DLA) in implementing the Artificial Neural Network (ANN).

The Deep Learning Accelerator (DLA) can have local memory, such as registers, buffers and/or caches, configured to store vector/matrix operands and the results of vector/matrix operations. Intermediate results in the registers can be pipelined/shifted in the Deep Learning Accelerator (DLA) as operands for subsequent vector/matrix operations to reduce time and energy consumption in accessing memory/data and thus speed up typical patterns of vector/matrix operations in implementing a typical Artificial Neural Network (ANN). The capacity of registers, buffers and/or caches in the Deep Learning Accelerator (DLA) is typically insufficient to hold the entire data set for implementing the computation of a typical Artificial Neural Network (ANN). Thus, a random access memory coupled to the Deep Learning Accelerator (DLA) is configured to provide an improved data storage capability for implementing a typical Artificial Neural Network (ANN). For example, the Deep Learning Accelerator (DLA) loads data and instructions from the random access memory and stores results back into the random access memory.

The communication bandwidth between the Deep Learning Accelerator (DLA) and the random access memory is configured to optimize or maximize the utilization of the computation power of the Deep Learning Accelerator (DLA). For example, high communication bandwidth can be provided between the Deep Learning Accelerator (DLA) and the random access memory such that vector/matrix operands can be loaded from the random access memory into the Deep Learning Accelerator (DLA) and results stored back into the random access memory in a time period that is approximately equal to the time for the Deep Learning Accelerator (DLA) to perform the computations on the vector/matrix operands. The granularity of the Deep Learning Accelerator (DLA) can be configured to increase the ratio between the amount of computations performed by the Deep Learning Accelerator (DLA) and the size of the vector/matrix operands such that the data access traffic between the Deep Learning Accelerator (DLA) and the random access memory can be reduced, which can reduce the requirement on the communication bandwidth between the Deep Learning Accelerator (DLA) and the random access memory. Thus, the bottleneck in data/memory access can be reduced or eliminated.

Sensor fusion uses inputs from multiple sensors to generate inferences. For example, radars, lidars, cameras sensing in lights visible to human eyes and/or infrared light, and/or imaging devices sensing via ultrasound can be used to generate image data representative of a scene of objects and/or items using different technologies and/or different frequency ranges. Radar images, lidar images, camera images, and ultrasound images can each have advantages and disadvantages under different conditions. Object identification and/or recognition based on the combination of radar images, lidar images, camera images, and/or ultrasound images can be more accurate by taking advantages of the strengths of the different sensors and the additional information offered by different sensors.

Different Artificial Neural Networks can be used to process the input data of different image sensors separately. A further Artificial Neural Network can be used to process the input data of the different image sensors together. The further Artificial Neural Network can receive, as input, intermediate processing results from the different Artificial Neural Networks configured for the different image sensors respectively. A combination of the Artificial Neural Networks can be compiled into a large Artificial Neural Network that generates not only inferences separately from the inputs of the individual image sensors, but also outputs derived from the sensor data of the image sensors as a whole. Less accurate outputs from the sensor data of the individual image sensors can be generated sooner than more accurate output from the combined sensor data of the image sensors. In some instances, the outputs (e.g., features, identifications and/or classifications) recognized from the sensor data of one of the image sensors can be used to simplify or assist the processing of the sensor data of other image sensors.

When the description of the various Artificial Neural Networks are provided as inputs to a compiler, the compiler can generate a combined set of optimized instructions by reducing overlapping computations and/or coordinate the timing of the generation of the outputs from the different Artificial Neural Networks.

FIG. 1 shows an integrated circuit device (101) having a Deep Learning Accelerator (103) and random access memory (105) configured according to one embodiment.

The Deep Learning Accelerator (103) in FIG. 1 includes processing units (111), a control unit (113), and local memory (115). When vector and matrix operands are in the local memory (115), the control unit (113) can use the processing units (111) to perform vector and matrix operations in accordance with instructions. Further, the control unit (113) can load instructions and operands from the random access memory (105) through a memory interface (117) and a high speed/bandwidth connection (119).

The integrated circuit device (101) is configured to be enclosed within an integrated circuit package with pins or contacts for a memory controller interface (107).

The memory controller interface (107) is configured to support a standard memory access protocol such that the integrated circuit device (101) appears to a typical memory controller in a way same as a conventional random access memory device having no Deep Learning Accelerator (DLA) (103). For example, a memory controller external to the integrated circuit device (101) can access, using a standard memory access protocol through the memory controller interface (107), the random access memory (105) in the integrated circuit device (101).

The integrated circuit device (101) is configured with a high bandwidth connection (119) between the random access memory (105) and the Deep Learning Accelerator (DLA) (103) that are enclosed within the integrated circuit device (101). The bandwidth of the connection (119) is higher than the bandwidth of the connection (109) between the random access memory (105) and the memory controller interface (107).

In one embodiment, both the memory controller interface (107) and the memory interface (117) are configured to access the random access memory (105) via a same set of buses or wires. Thus, the bandwidth to access the random access memory (105) is shared between the memory interface (117) and the memory controller interface (107). Alternatively, the memory controller interface (107) and the memory interface (117) are configured to access the random access memory (105) via separate sets of buses or wires. Optionally, the random access memory (105) can include multiple sections that can be accessed concurrently via the connection (119). For example, when the memory interface (117) is accessing a section of the random access memory (105), the memory controller interface (107) can concurrently access another section of the random access memory (105). For example, the different sections can be configured on different integrated circuit dies and/or different planes/banks of memory cells; and the different sections can be accessed in parallel to increase throughput in accessing the random access memory (105). For example, the memory controller interface (107) is configured to access one data unit of a predetermined size at a time; and the memory interface (117) is configured to access multiple data units, each of the same predetermined size, at a time.

In one embodiment, the random access memory (105) and the integrated circuit device (101) are configured on different integrated circuit dies configured within a same integrated circuit package. Further, the random access memory (105) can be configured on one or more integrated circuit dies that allows parallel access of multiple data elements concurrently.

In some implementations, the number of data elements of a vector or matrix that can be accessed in parallel over the connection (119) corresponds to the granularity of the Deep Learning Accelerator (DLA) operating on vectors or matrices. For example, when the processing units (111) can operate on a number of vector/matrix elements in parallel, the connection (119) is configured to load or store the same number, or multiples of the number, of elements via the connection (119) in parallel.

Optionally, the data access speed of the connection (119) can be configured based on the processing speed of the Deep Learning Accelerator (DLA) (103). For example, after an amount of data and instructions have been loaded into the local memory (115), the control unit (113) can execute an instruction to operate on the data using the processing units (111) to generate output. Within the time period of processing to generate the output, the access bandwidth of the connection (119) allows the same amount of data and instructions to be loaded into the local memory (115) for the next operation and the same amount of output to be stored back to the random access memory (105). For example, while the control unit (113) is using a portion of the local memory (115) to process data and generate output, the memory interface (117) can offload the output of a prior operation into the random access memory (105) from, and load operand data and instructions into, another portion of the local memory (115). Thus, the utilization and performance of the Deep Learning Accelerator (DLA) are not restricted or reduced by the bandwidth of the connection (119).

The random access memory (105) can be used to store the model data of an Artificial Neural Network (ANN) and to buffer input data for the Artificial Neural Network (ANN). The model data does not change frequently. The model data can include the output generated by a compiler for the Deep Learning Accelerator (DLA) to implement the Artificial Neural Network (ANN). The model data typically includes matrices used in the description of the Artificial Neural Network (ANN) and instructions generated for the Deep Learning Accelerator (DLA) (103) to perform vector/matrix operations of the Artificial Neural Network (ANN) based on vector/matrix operations of the granularity of the Deep Learning Accelerator (DLA) (103). The instructions operate not only on the vector/matrix operations of the Artificial Neural Network (ANN), but also on the input data for the Artificial Neural Network (ANN).

In one embodiment, when the input data is loaded or updated in the random access memory (105), the control unit (113) of the Deep Learning Accelerator (DLA) (103) can automatically execute the instructions for the Artificial Neural Network (ANN) to generate an output of the Artificial Neural Network (ANN). The output is stored into a predefined region in the random access memory (105). The Deep Learning Accelerator (DLA) (103) can execute the instructions without help from a Central Processing Unit (CPU). Thus, communications for the coordination between the Deep Learning Accelerator (DLA) (103) and a processor outside of the integrated circuit device (101) (e.g., a Central Processing Unit (CPU)) can be reduced or eliminated.

Optionally, the logic circuit of the Deep Learning Accelerator (DLA) (103) can be implemented via Complementary Metal Oxide Semiconductor (CMOS). For example, the technique of CMOS Under the Array (CUA) of memory cells of the random access memory (105) can be used to implement the logic circuit of the Deep Learning Accelerator (DLA) (103), including the processing units (111) and the control unit (113). Alternatively, the technique of CMOS in the Array of memory cells of the random access memory (105) can be used to implement the logic circuit of the Deep Learning Accelerator (DLA) (103).

In some implementations, the Deep Learning Accelerator (DLA) (103) and the random access memory (105) can be implemented on separate integrated circuit dies and connected using Through-Silicon Vias (TSV) for increased data bandwidth between the Deep Learning Accelerator (DLA) (103) and the random access memory (105). For example, the Deep Learning Accelerator (DLA) (103) can be formed on an integrated circuit die of a Field-Programmable Gate Array (FPGA) or Application Specific Integrated circuit (ASIC).

Alternatively, the Deep Learning Accelerator (DLA) (103) and the random access memory (105) can be configured in separate integrated circuit packages and connected via multiple point-to-point connections on a printed circuit board (PCB) for parallel communications and thus increased data transfer bandwidth.

The random access memory (105) can be volatile memory or non-volatile memory, or a combination of volatile memory and non-volatile memory. Examples of non-volatile memory include flash memory, memory cells formed based on negative-and (NAND) logic gates, negative-or (NOR) logic gates, Phase-Change Memory (PCM), magnetic memory (MRAM), resistive random-access memory, cross point storage and memory devices. A cross point memory device can use transistor-less memory elements, each of which has a memory cell and a selector that are stacked together as a column. Memory element columns are connected via two layers of wires running in perpendicular directions, where wires of one layer run in one direction in the layer that is located above the memory element columns, and wires of the other layer run in another direction and are located below the memory element columns. Each memory element can be individually selected at a cross point of one wire on each of the two layers. Cross point memory devices are fast and non-volatile and can be used as a unified memory pool for processing and storage. Further examples of non-volatile memory include Read-Only Memory (ROM), Programmable Read-Only Memory (PROM), Erasable Programmable Read-Only Memory (EPROM) and Electronically Erasable Programmable Read-Only Memory (EEPROM) memory, etc. Examples of volatile memory include Dynamic Random-Access Memory (DRAM) and Static Random-Access Memory (SRAM).

For example, non-volatile memory can be configured to implement at least a portion of the random access memory (105). The non-volatile memory in the random access memory (105) can be used to store the model data of an Artificial Neural Network (ANN). Thus, after the integrated circuit device (101) is powered off and restarts, it is not necessary to reload the model data of the Artificial Neural Network (ANN) into the integrated circuit device (101). Further, the non-volatile memory can be programmable/rewritable. Thus, the model data of the Artificial Neural Network (ANN) in the integrated circuit device (101) can be updated or replaced to implement an update Artificial Neural Network (ANN), or another Artificial Neural Network (ANN).

The processing units (111) of the Deep Learning Accelerator (DLA) (103) can include vector-vector units, matrix-vector units, and/or matrix-matrix units. Examples of units configured to perform for vector-vector operations, matrix-vector operations, and matrix-matrix operations are discussed below in connection with FIGS. 2-4.

Figure 2:
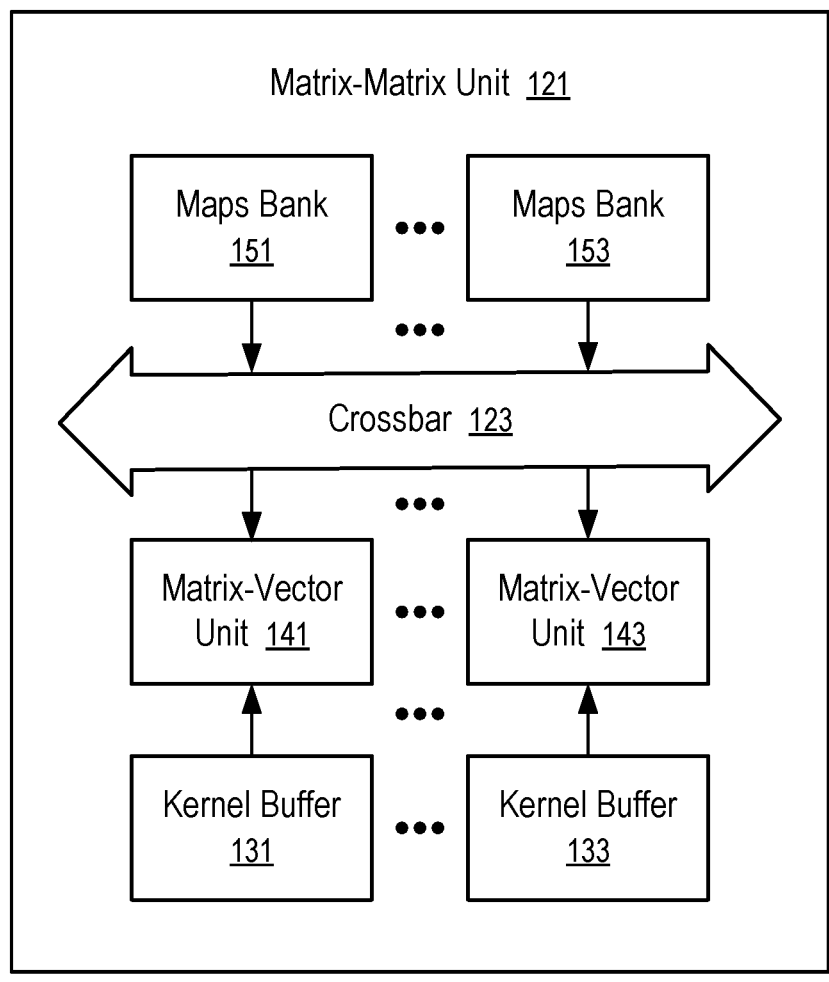
FIG. 2 shows a processing unit configured to perform matrix-matrix operations according to one embodiment.

FIG. 2 shows a processing unit configured to perform matrix-matrix operations according to one embodiment. For example, the matrix-matrix unit (121) of FIG. 2 can be used as one of the processing units (111) of the Deep Learning Accelerator (DLA) (103) of FIG. 1.

In FIG. 2, the matrix-matrix unit (121) includes multiple kernel buffers (131 to 133) and multiple the maps banks (151 to 153). Each of the maps banks (151 to 153) stores one vector of a matrix operand that has multiple vectors stored in the maps banks (151 to 153) respectively; and each of the kernel buffers (131 to 133) stores one vector of another matrix operand that has multiple vectors stored in the kernel buffers (131 to 133) respectively. The matrix-matrix unit (121) is configured to perform multiplication and accumulation operations on the elements of the two matrix operands, using multiple matrix-vector units (141 to 143) that operate in parallel.

A crossbar (123) connects the maps banks (151 to 153) to the matrix-vector units (141 to 143). The same matrix operand stored in the maps bank (151 to 153) is provided via the crossbar (123) to each of the matrix-vector units (141 to 143); and the matrix-vector units (141 to 143) receives data elements from the maps banks (151 to 153) in parallel. Each of the kernel buffers (131 to 133) is connected to a respective one in the matrix-vector units (141 to 143) and provides a vector operand to the respective matrix-vector unit. The matrix-vector units (141 to 143) operate concurrently to compute the operation of the same matrix operand, stored in the maps banks (151 to 153) multiplied by the corresponding vectors stored in the kernel buffers (131 to 133). For example, the matrix-vector unit (141) performs the multiplication operation on the matrix operand stored in the maps banks (151 to 153) and the vector operand stored in the kernel buffer (131), while the matrix-vector unit (143) is concurrently performing the multiplication operation on the matrix operand stored in the maps banks (151 to 153) and the vector operand stored in the kernel buffer (133).

Figure 3:
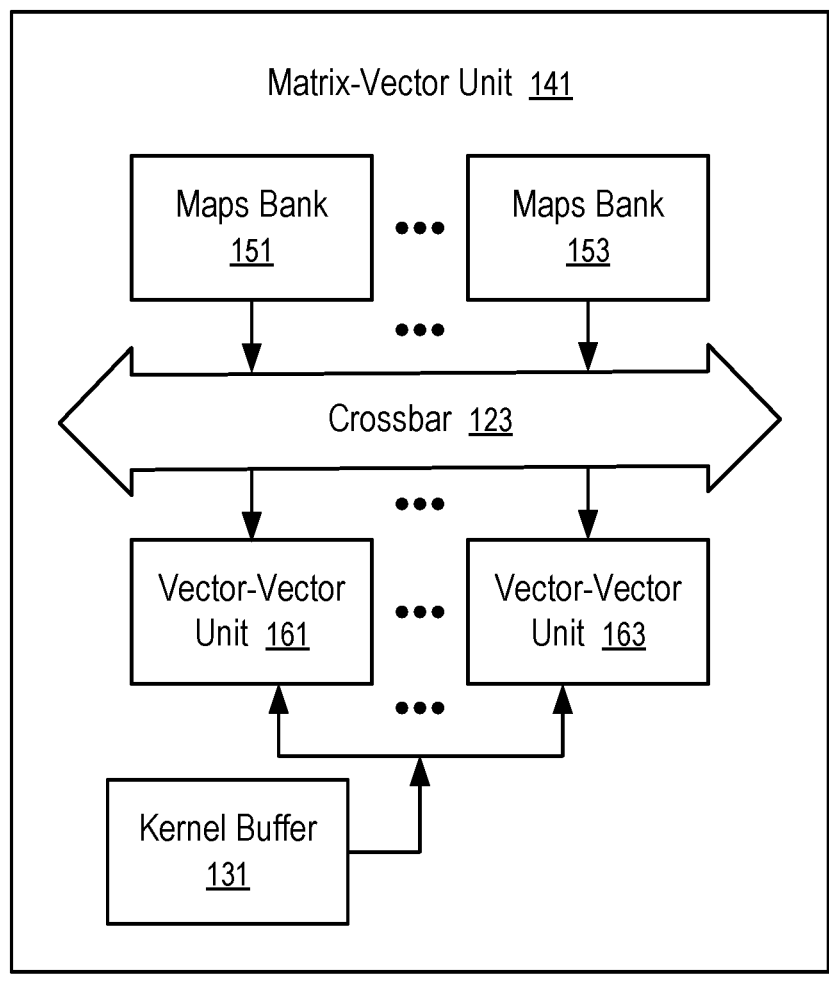
FIG. 3 shows a processing unit configured to perform matrix-vector operations according to one embodiment.

Each of the matrix-vector units (141 to 143) in FIG. 2 can be implemented in a way as illustrated in FIG. 3.

FIG. 3 shows a processing unit configured to perform matrix-vector operations according to one embodiment. For example, the matrix-vector unit (141) of FIG. 3 can be used as any of the matrix-vector units in the matrix-matrix unit (121) of FIG. 2.

In FIG. 3, each of the maps banks (151 to 153) stores one vector of a matrix operand that has multiple vectors stored in the maps banks (151 to 153) respectively, in a way similar to the maps banks (151 to 153) of FIG. 2. The crossbar (123) in FIG. 3 provides the vectors from the maps banks (151) to the vector-vector units (161 to 163) respectively. A same vector stored in the kernel buffer (131) is provided to the vector-vector units (161 to 163).

The vector-vector units (161 to 163) operate concurrently to compute the operation of the corresponding vector operands, stored in the maps banks (151 to 153) respectively, multiplied by the same vector operand that is stored in the kernel buffer (131). For example, the vector-vector unit (161) performs the multiplication operation on the vector operand stored in the maps bank (151) and the vector operand stored in the kernel buffer (131), while the vector-vector unit (163) is concurrently performing the multiplication operation on the vector operand stored in the maps bank (153) and the vector operand stored in the kernel buffer (131).

When the matrix-vector unit (141) of FIG. 3 is implemented in a matrix-matrix unit (121) of FIG. 2, the matrix-vector unit (141) can use the maps banks (151 to 153), the crossbar (123) and the kernel buffer (131) of the matrix-matrix unit (121).

Figure 4:
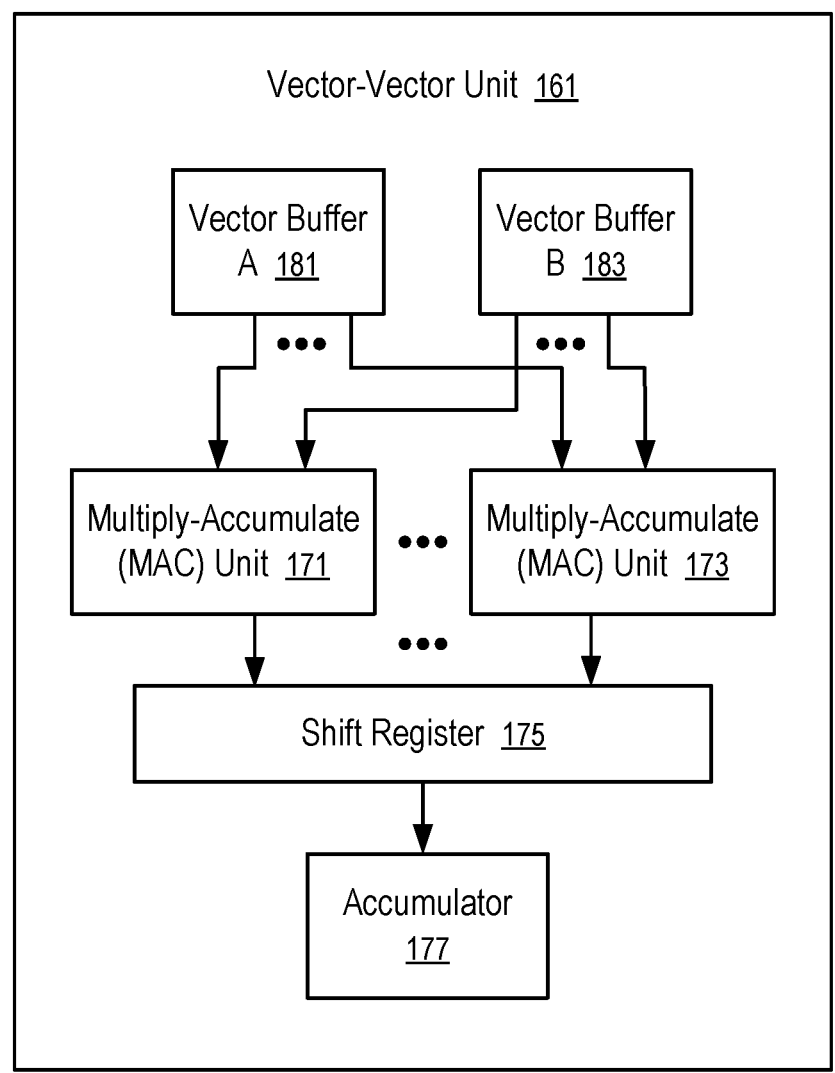
FIG. 4 shows a processing unit configured to perform vector-vector operations according to one embodiment.

Each of the vector-vector units (161 to 163) in FIG. 3 can be implemented in a way as illustrated in FIG. 4.

FIG. 4 shows a processing unit configured to perform vector-vector operations according to one embodiment. For example, the vector-vector unit (161) of FIG. 4 can be used as any of the vector-vector units in the matrix-vector unit (141) of FIG. 3.

In FIG. 4, the vector-vector unit (161) has multiple multiply-accumulate units (171 to 173). Each of the multiply-accumulate units (e.g., 173) can receive two numbers as operands, perform multiplication of the two numbers, and add the result of the multiplication to a sum maintained in the multiply-accumulate (MAC) unit.

Each of the vector buffers (181 and 183) stores a list of numbers. A pair of numbers, each from one of the vector buffers (181 and 183), can be provided to each of the multiply-accumulate units (171 to 173) as input. The multiply-accumulate units (171 to 173) can receive multiple pairs of numbers from the vector buffers (181 and 183) in parallel and perform the multiply-accumulate (MAC) operations in parallel. The outputs from the multiply-accumulate units (171 to 173) are stored into the shift register (175); and an accumulator (177) computes the sum of the results in the shift register (175).

When the vector-vector unit (161) of FIG. 4 is implemented in a matrix-vector unit (141) of FIG. 3, the vector-vector unit (161) can use a maps bank (e.g., 151 or 153) as one vector buffer (181), and the kernel buffer (131) of the matrix-vector unit (141) as another vector buffer (183).

The vector buffers (181 and 183) can have a same length to store the same number/count of data elements. The length can be equal to, or the multiple of, the count of multiply-accumulate units (171 to 173) in the vector-vector unit (161). When the length of the vector buffers (181 and 183) is the multiple of the count of multiply-accumulate units (171 to 173), a number of pairs of inputs, equal to the count of the multiply-accumulate units (171 to 173), can be provided from the vector buffers (181 and 183) as inputs to the multiply-accumulate units (171 to 173) in each iteration; and the vector buffers (181 and 183) feed their elements into the multiply-accumulate units (171 to 173) through multiple iterations.

In one embodiment, the communication bandwidth of the connection (119) between the Deep Learning Accelerator (DLA) (103) and the random access memory (105) is sufficient for the matrix-matrix unit (121) to use portions of the random access memory (105) as the maps banks (151 to 153) and the kernel buffers (131 to 133).

In another embodiment, the maps banks (151 to 153) and the kernel buffers (131 to 133) are implemented in a portion of the local memory (115) of the Deep Learning Accelerator (DLA) (103). The communication bandwidth of the connection (119) between the Deep Learning Accelerator (DLA) (103) and the random access memory (105) is sufficient to load, into another portion of the local memory (115), matrix operands of the next operation cycle of the matrix-matrix unit (121), while the matrix-matrix unit (121) is performing the computation in the current operation cycle using the maps banks (151 to 153) and the kernel buffers (131 to 133) implemented in a different portion of the local memory (115) of the Deep Learning Accelerator (DLA) (103).

Figure 5:
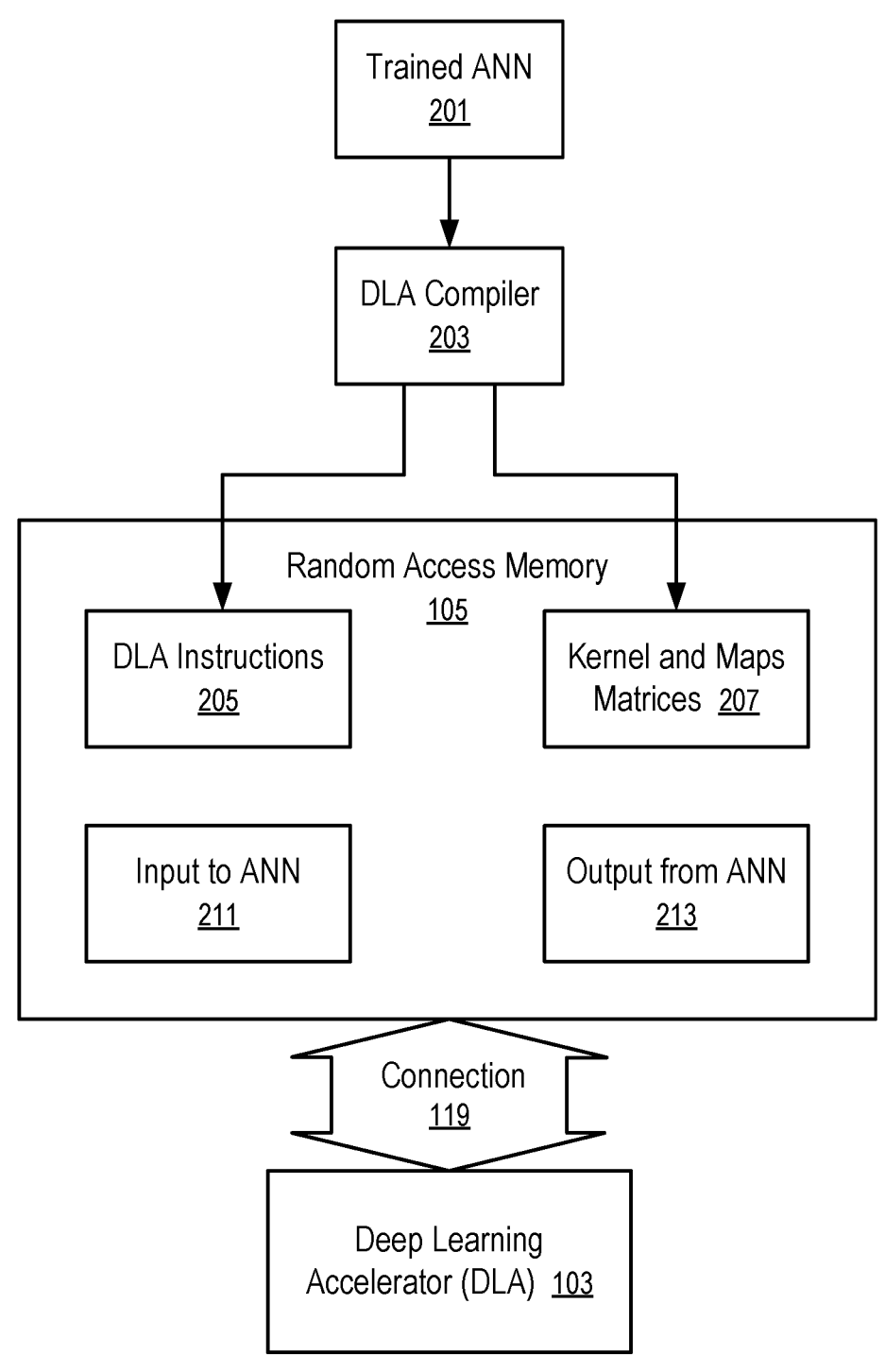
FIG. 5 shows a Deep Learning Accelerator and random access memory configured to autonomously apply inputs to a trained Artificial Neural Network according to one embodiment.

FIG. 5 shows a Deep Learning Accelerator and random access memory configured to autonomously apply inputs to a trained Artificial Neural Network according to one embodiment.

An Artificial Neural Network (ANN) (201) that has been trained through machine learning (e.g., deep learning) can be described in a standard format (e.g., Open Neural Network Exchange (ONNX)). The description of the trained Artificial Neural Network (ANN) (201) in the standard format identifies the properties of the artificial neurons and their connectivity.

In FIG. 5, a Deep Learning Accelerator (DLA) compiler (203) converts trained Artificial Neural Network (ANN) (201) by generating instructions (205) for a Deep Learning Accelerator (DLA) (103) and matrices (207) corresponding to the properties of the artificial neurons and their connectivity. The instructions (205) and the matrices (207) generated by the DLA compiler (203) from the trained Artificial Neural Network (ANN) (201) can be stored in random access memory (105) for the Deep Learning Accelerator (DLA) (103).

For example, the random access memory (105) and the Deep Learning Accelerator (DLA) (103) can be connected via a high bandwidth connection (119) in a way as in the integrated circuit device (101) of FIG. 1. The autonomous computation of FIG. 5 based on the instructions (205) and the matrices (207) can be implemented in the integrated circuit device (101) of FIG. 1. Alternatively, the random access memory (105) and the Deep Learning Accelerator (DLA) (103) can be configured on a printed circuit board with multiple point to point serial buses running in parallel to implement the connection (119).

In FIG. 5, after the results of the DLA compiler (203) are stored in the random access memory (105), the application of the trained Artificial Neural Network (ANN) (201) to process an input (211) to the trained Artificial Neural Network (ANN) (201) to generate the corresponding output (213) of the trained Artificial Neural Network (ANN) (201) can be triggered by the presence of the input (211) in the random access memory (105), or another indication provided in the random access memory (105).

In response, the Deep Learning Accelerator (DLA) (103) executes the instructions (205) to combine the input (211) and the matrices (207). The execution of the instructions (205) can include the generation of maps matrices for the maps banks (151 to 153) of one or more matrix-matrix units (e.g., 121) of the Deep Learning Accelerator (DLA) (103).

In some embodiments, the inputs to Artificial Neural Network (ANN) (201) is in the form of an initial maps matrix. Portions of the initial maps matrix can be retrieved from the random access memory (105) as the matrix operand stored in the maps banks (151 to 153) of a matrix-matrix unit (121). Alternatively, the DLA instructions (205) also include instructions for the Deep Learning Accelerator (DLA) (103) to generate the initial maps matrix from the input (211).

According to the DLA instructions (205), the Deep Learning Accelerator (DLA) (103) loads matrix operands into the kernel buffers (131 to 133) and maps banks (151 to 153) of its matrix-matrix unit (121). The matrix-matrix unit (121) performs the matrix computation on the matrix operands. For example, the DLA instructions (205) break down matrix computations of the trained Artificial Neural Network (ANN) (201) according to the computation granularity of the Deep Learning Accelerator (DLA) (103) (e.g., the sizes/dimensions of matrices that loaded as matrix operands in the matrix-matrix unit (121)) and applies the input feature maps to the kernel of a layer of artificial neurons to generate output as the input for the next layer of artificial neurons.

Upon completion of the computation of the trained Artificial Neural Network (ANN) (201) performed according to the instructions (205), the Deep Learning Accelerator (DLA) (103) stores the output (213) of the Artificial Neural Network (ANN) (201) at a pre-defined location in the random access memory (105), or at a location specified in an indication provided in the random access memory (105) to trigger the computation.

When the technique of FIG. 5 is implemented in the integrated circuit device (101) of FIG. 1, an external device connected to the memory controller interface (107) can write the input (211) into the random access memory (105) and trigger the autonomous computation of applying the input (211) to the trained Artificial Neural Network (ANN) (201) by the Deep Learning Accelerator (DLA) (103). After a period of time, the output (213) is available in the random access memory (105); and the external device can read the output (213) via the memory controller interface (107) of the integrated circuit device (101).

For example, a predefined location in the random access memory (105) can be configured to store an indication to trigger the autonomous execution of the instructions (205) by the Deep Learning Accelerator (DLA) (103). The indication can optionally include a location of the input (211) within the random access memory (105). Thus, during the autonomous execution of the instructions (205) to process the input (211), the external device can retrieve the output generated during a previous run of the instructions (205), and/or store another set of input for the next run of the instructions (205).

Optionally, a further predefined location in the random access memory (105) can be configured to store an indication of the progress status of the current run of the instructions (205). Further, the indication can include a prediction of the completion time of the current run of the instructions (205) (e.g., estimated based on a prior run of the instructions (205)). Thus, the external device can check the completion status at a suitable time window to retrieve the output (213).

In some embodiments, the random access memory (105) is configured with sufficient capacity to store multiple sets of inputs (e.g., 211) and outputs (e.g., 213). Each set can be configured in a predetermined slot/area in the random access memory (105).

The Deep Learning Accelerator (DLA) (103) can execute the instructions (205) autonomously to generate the output (213) from the input (211) according to matrices (207) stored in the random access memory (105) without helps from a processor or device that is located outside of the integrated circuit device (101).

In a method according to one embodiment, random access memory (105) of a computing device (e.g., 101) can be accessed using an interface (107) of the computing device (e.g., 101) to a memory controller. The computing device (e.g., 101) can have processing units (e.g., 111) configured to perform at least computations on matrix operands, such as a matrix operand stored in maps banks (151 to 153) and a matrix operand stored in kernel buffers (131 to 133).

For example, the computing device (e.g., 101) can be enclosed within an integrated circuit package; and a set of connections can connect the interface (107) to the memory controller that is located outside of the integrated circuit package.

Instructions (205) executable by the processing units (e.g., 111) can be written into the random access memory (105) through the interface (107).

Matrices (207) of an Artificial Neural Network (201) can be written into the random access memory (105) through the interface (107). The matrices (207) identify the property and/or state of the Artificial Neural Network (201).

Optionally, at least a portion of the random access memory (105) is non-volatile and configured to store the instructions (205) and the matrices (207) of the Artificial Neural Network (201).

First input (211) to the Artificial Neural Network can be written into the random access memory (105) through the interface (107).

An indication is provided in the random access memory (105) to cause the processing units (111) to start execution of the instructions (205). In response to the indication, the processing units (111) execute the instructions to combine the first input (211) with the matrices (207) of the Artificial Neural Network (201) to generate first output (213) from the Artificial Neural Network (201) and store the first output (213) in the random access memory (105).

For example, the indication can be an address of the first input (211) in the random access memory (105); and the indication can be stored at a predetermined location in the random access memory (105) to cause the initiation of the execution of the instructions (205) for the input (211) identified by the address. Optionally, the indication can also include an address for storing the output (213).

The first output (213) can be read, through the interface (107), from the random access memory (105).

For example, the computing device (e.g., 101) can have a Deep Learning Accelerator (103) formed on a first integrated circuit die and the random access memory (105) formed on one or more second integrated circuit dies. The connection (119) between the first integrated circuit die and the one or more second integrated circuit dies can include Through-Silicon Vias (TSVs) to provide high bandwidth for memory access.

For example, a description of the Artificial Neural Network (201) can be converted using a compiler (203) into the instructions (205) and the matrices (207). The combination of the instructions (205) and the matrices (207) stored in the random access memory (105) and the Deep Learning Accelerator (103) provides an autonomous implementation of the Artificial Neural Network (201) that can automatically convert input (211) to the Artificial Neural Network (201) to its output (213).

For example, during a time period in which the Deep Learning Accelerator (103) executes the instructions (205) to generate the first output (213) from the first input (211) according to the matrices (207) of the Artificial Neural Network (201), the second input to Artificial Neural Network (201) can be written into the random access memory (105) through the interface (107) at an alternative location. After the first output (213) is stored in the random access memory (105), an indication can be provided in the random access memory to cause the Deep Learning Accelerator (103) to again start the execution of the instructions and generate second output from the second input.

During the time period in which the Deep Learning Accelerator (103) executes the instructions (205) to generate the second output from the second input according to the matrices (207) of the Artificial Neural Network (201), the first output (213) can be read from the random access memory (105) through the interface (107); and a further input can be written into the random access memory to replace the first input (211), or written at a different location. The process can be repeated for a sequence of inputs.

The Deep Learning Accelerator (103) can include at least one matrix-matrix unit (121) that can execute an instruction on two matrix operands. The two matrix operands can be a first matrix and a second matrix. Each of two matrices has a plurality of vectors. The matrix-matrix unit (121) can include a plurality of matrix-vector units (141 to 143) configured to operate in parallel. Each of the matrix-vector units (141 to 143) are configured to operate, in parallel with other matrix-vector units, on the first matrix and one vector from second matrix. Further, each of the matrix-vector units (141 to 143) can have a plurality of vector-vector units (161 to 163) configured to operate in parallel. Each of the vector-vector units (161 to 163) is configured to operate, in parallel with other vector-vector units, on a vector from the first matrix and a common vector operand of the corresponding matrix-vector unit. Further, each of the vector-vector units (161 to 163) can have a plurality of multiply-accumulate units (171 to 173) configured to operate in parallel.

The Deep Learning Accelerator (103) can have local memory (115) and a control unit (113) in addition to the processing units (111). The control unit (113) can load instructions (205) and matrix operands (e.g., matrices (207)) from the random access memory (105) for execution by the processing units (111). The local memory can cache matrix operands used by the matrix-matrix unit. The connection (119) can be configured with a bandwidth sufficient to load a set of matrix operands from the random access memory (105) to the local memory (115) during a time period in which the matrix-matrix unit performs operations on two other matrix operands. Further, during the time period, the bandwidth is sufficient to store a result, generated by the matrix-matrix unit (121) in a prior instruction execution, from the local memory (115) to the random access memory (105).

Figure 6:
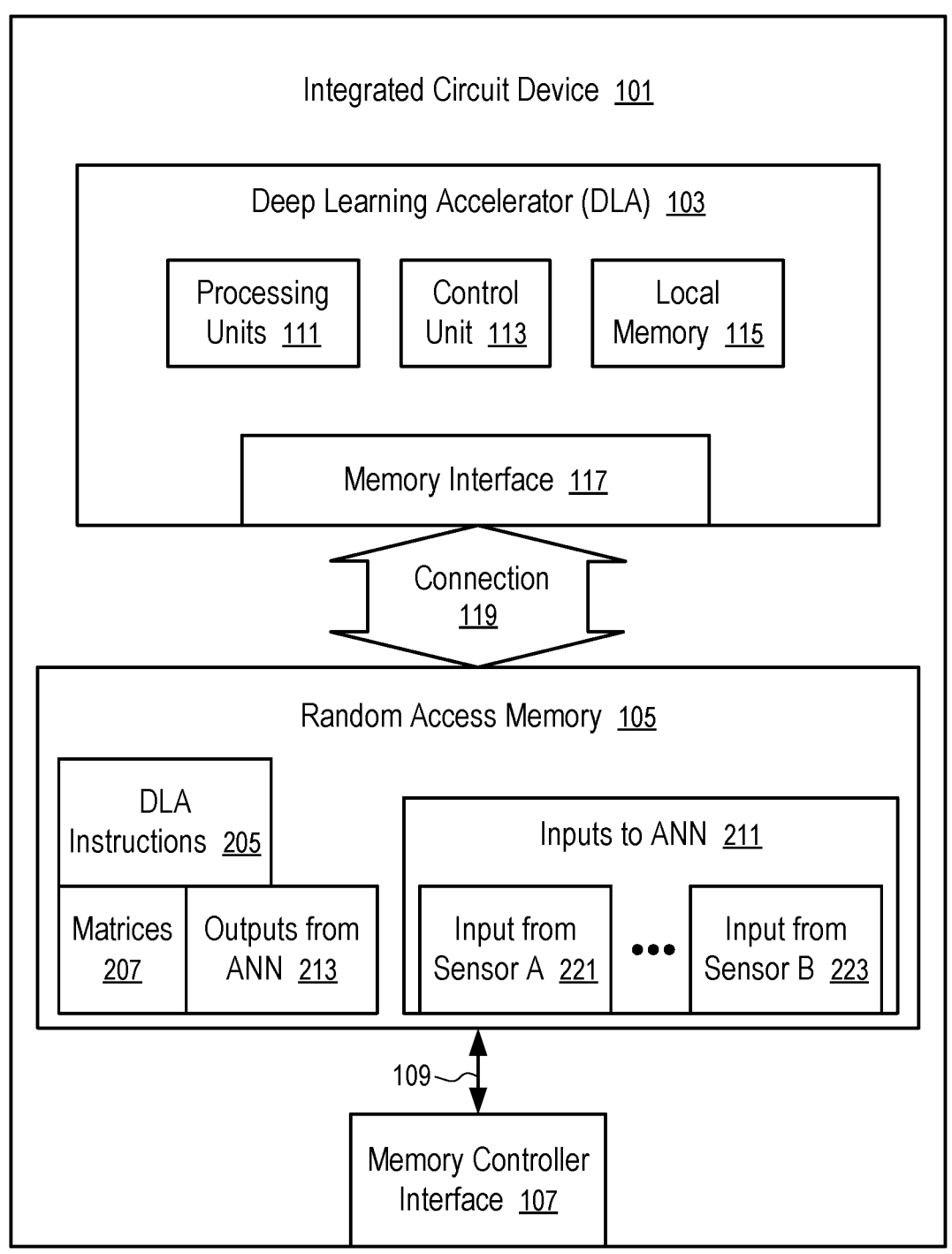
FIGS. 6-8 illustrate sensor fusion implemented in a Deep Learning Accelerator and random access memory configured according to some embodiments.
Figure 7:
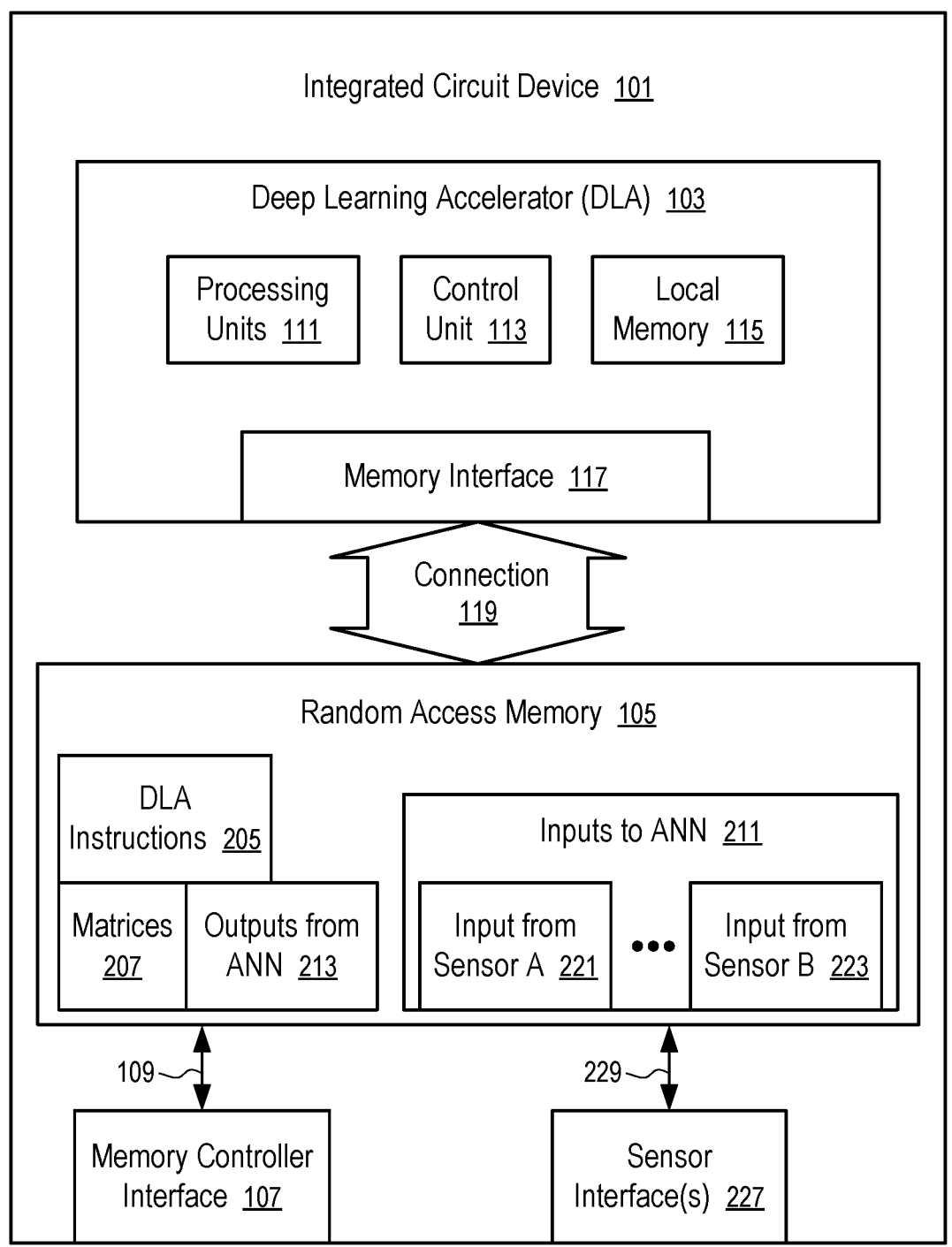
Figure 8:
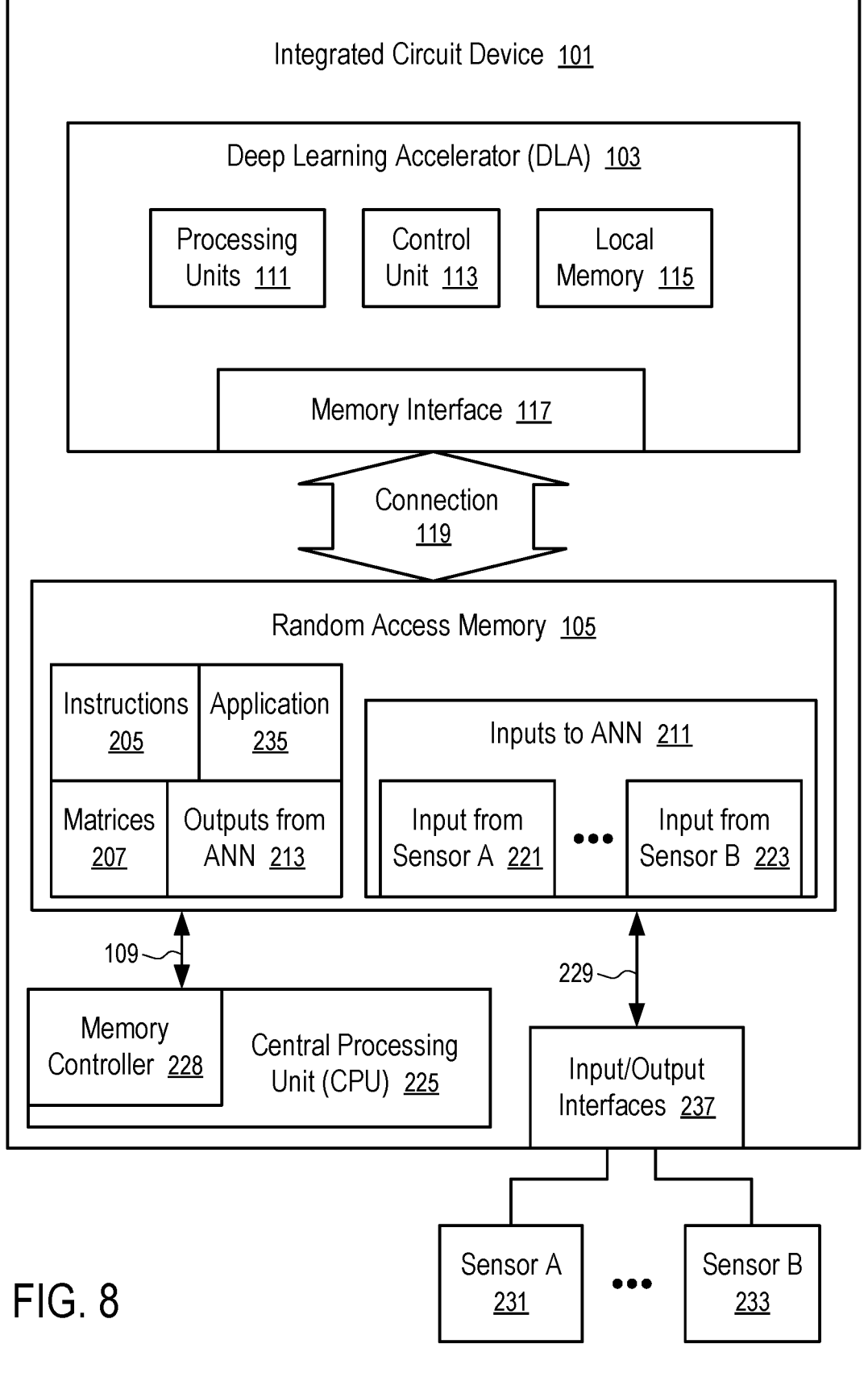

FIGS. 6-8 illustrate sensor fusion implemented in a Deep Learning Accelerator and random access memory configured according to some embodiments.

In FIG. 6, the Random Access Memory (RAM) (105) includes a portion configured to accept the input (211) to the Artificial Neural Network (ANN) (201). The portion of the Random Access Memory (RAM) (105) is partitioned into a plurality of slots for accepting inputs from different types of sensors, such as radar, lidar, camera, and/or ultrasound imaging device.

For example, each of the slots can be configured to accept an input from a predefined type of sensors. For example, a slot of the input (211) to the Artificial Neural Network (ANN) (201) can be reserved for the input (221) from sensor A (e.g., representative of radar images or lidar images); and another slot of the input (211) to the Artificial Neural Network (ANN) (201) can be reserved for the input (223) from sensor B (e.g., representative of camera images or ultrasound images).

In some implementations, which slot is used for the sensor data of what type is dynamically specified in the Random Access Memory (RAM) (105). For example, a slot in the Random Access Memory (RAM) (105) can be initially used to store an input (221) from sensor A (e.g., representative of radar images or lidar images) and subsequently reallocated to store an input (223) from sensor B (e.g., representative of camera images or ultrasound images). For example, the input (221) from sensor A can include data identifying its type of input (e.g., radar image stream); and the input (223) from sensor B can include data identifying its type of input (e.g., camera image stream).

The DLA instructions (205) generated by the DLA compiler (203) can be configured to dynamically apply the sensor inputs (e.g., 221) to the corresponding input neurons of the Artificial Neural Network (ANN) (201) based on the types of the inputs (e.g., 221) specified for the slot. The input neurons correspond to predetermined portions of the matrices (207), as identified via the DLA instructions (205).

Alternatively, the input slots in Random Access Memory (RAM) (105) can be pre-allocated for predetermined types of sensors. For example, during a startup process, the types of sensors connected to the sensor interface(s) (227) of integrated circuit device (101) are identified. The slots are allocated respectively for the sensors to store their inputs (e.g., 223).

The output (213) from the Artificial Neural Network (ANN) (201) can include outputs derived from the inputs (221, . . . , 223) respectively for the different sensors, such as outputs recognized from radar images, outputs recognized from lidar images, output recognized from camera images, etc.

Further, the output (213) from the Artificial Neural Network (ANN) (201) can include an output generated from the sensor fusion of the inputs (221, . . . , 223), such as identifications or classifications of one or more objects recognized from a combination of radar images, lidar images, camera images, and/or ultrasound images, etc.

For example, the execution of the DLA instructions (205) generates radar image features, lidar image features, camera image features. Further, the execution of the DLA instructions (205) generates sensor fusion features identified or recognized based on a combination of the radar image features, the lidar image features, the camera image features, etc.

For example, the execution of the DLA instructions (205) generates identifications of an object determined from a radar image, a lidar image, a camera image respectively. The radar identification of the object is determined from the radar image features; the lidar identification of the object is determined from the lidar image features; and the camera identification is determined from the camera image features. Further, the execution of the DLA instructions (205) generates a sensor fusion identification of the object that is identified or recognized based on a combination of a radar image, a lidar image, a camera image, etc. For example, the sensor fusion identification of the object can be determined from a combination of radar image features, lidar image features, camera image features, etc.

In FIG. 6, the different sensors write the inputs (221, . . . , 223) into the Random Access Memory (RAM) (105) using a memory controller interface (107). For example, a host system, a processor, or a direct memory access (DMA) controller can use the memory controller interface (107) to store the inputs (221, . . . , 223) into the respective slots in the Random Access Memory (RAM) (105) on behalf of the different sensors. The host system or the processor can use the memory controller interface (107) to retrieve the output (213) from the Artificial Neural Network (ANN) (201).

Alternatively, one or more sensor interfaces can be provided to allow one or more sensors to stream inputs (e.g., 221) into the Random Access Memory (RAM) (105). The sensor interfaces can be used independent on the host system/processor using the memory controller interface (107) to access the output (213) from the Artificial Neural Network (ANN) (201), as illustrated in FIG. 7.

In FIG. 7, one or more sensor interfaces (227) are provided to allow one or more sensor devices to write inputs (221, . . . , 223) into the Random Access Memory (RAM) (105). For example, radar, lidar, and a camera can write parallel streams of radar images, lidar images and camera images into the Random Access Memory (RAM) (105). For example, one sensor (e.g., radar) can use a serial connection to a dedicated sensor interface (e.g., 227) to write its input (e.g., 221) into the Random Access Memory (RAM) (105); and another sensor (e.g., camera or lidar) can use another serial connection to another dedicated interface to write its input (e.g., 223) into the Random Access Memory (RAM) (105). The inputs (e.g., radar images and camera images) can be written into the Random Access Memory (RAM) (105) concurrently.

FIG. 7 illustrates an example in which the connections (109 and 229) connect the memory controller interface (107) and the sensor interface(s) (227) to the Random Access Memory (RAM) (105) directly. Alternatively, the connection (109) and the connection (229) can be configured to connect the memory controller interface (107) and the sensor interface(s) (227) to the Random Access Memory (RAM) (105) indirectly through the memory interface (117) and/or the high bandwidth connection (119) between the Deep Learning Accelerator (DLA) (103) and the Random Access Memory (RAM) (105).

The integrated circuit device (101) of FIG. 8 includes a Central Processing Unit (CPU) (225). The Central Processing Unit (CPU) (225) can execute instructions like a typical host system/processor. Thus, the Random Access Memory (RAM) (105) can store not only DLA instructions (205) for execution by Deep Learning Accelerator (DLA) (103), but also instructions of an application (235) for execution by the Central Processing Unit (CPU) (225).

The integrated circuit device (101) of FIG. 8 has one or more input/output interfaces (237). Sensors (231, . . . , 233) can stream their inputs into the Random Access Memory (RAM) (105) through the one or more input/output interfaces (237). For example, the sensor A (231) can stream its input (221) from sensor A (e.g., representative of radar images or camera images) into the Random Access Memory (RAM) (105) (e.g., to provide radar images or camera images); and the sensor B (233) can stream its input (223) from sensor B into the Random Access Memory (RAM) (105) (e.g., to provide lidar images or ultrasound images).

Further, the application (235) running in the Central Processing Unit (CPU) (225) can use the input/output interfaces (237) to generate alerts, audio/video outputs, network communication signals, and/or control commands for peripheral devices.

FIG. 8 illustrates an example in which the connections (109 and 229) connect the memory controller (228) and the input/output interfaces (237) to the Random Access Memory (RAM) (105) directly. Alternatively, the connection (109) and the connection (229) can be configured to connect the memory controller (228) and the input/output interface(s) (237) to the Random Access Memory (RAM) (105) indirectly via the memory interface (117) and the high bandwidth connection (119) between the Deep Learning Accelerator (DLA) (103) and the Random Access Memory (RAM) (105). In other implementations, the input/output interfaces (237) access the Random Access Memory (RAM) (105) via the memory controller (228), the Central Processing Unit (CPU) (225), or another controller.

For example, the input/output interfaces (237) can be configured to support serial connections to peripheral devices, such as radar, lidar, camera, display device, etc. For example, the input/output interfaces (237) can include a peripheral component interconnect express (PCIe) interface, a universal serial bus (USB) interface, a Mobile Industry Processor Interface (MIPI), and/or a camera interface, etc.

FIG. 9 shows a method of sensor fusion according to one embodiment. For example, the method of FIG. 9 can be implemented in the integrated circuit device (101) of FIG. 1, FIG. 6, FIG. 7, FIG., 8 and/or the system of FIG. 5.

At block 301, first data representative of parameters of an artificial neural network (201) is stored into random access memory (105) of a device (e.g., 101). For example, the parameters can include kernel and maps matrices (207) of the artificial neural network (201) trained using a machine learning and/or deep learning technique.

At block 303, second data representative of instructions (e.g., 205) executable to implement matrix computations of the artificial neural network (201) is stored into the random access memory (105) of the device (e.g., 101). The matrix computations are implemented using at least the first data stored in the random access memory (105).

At block 305, at least one interface of the device (e.g., 101) receives third data representative of a plurality of inputs from a plurality of sensors respectively.

For example, the at least one interface can include the memory controller interface (107) illustrated in FIGS. 6-8, sensor interface(s) (227) illustrated in FIG. 7, and/or input/output interfaces (237) illustrated in FIG. 8.

For example, the plurality of inputs can include inputs (221, . . . , 223) illustrated in FIGS. 6-8; and the plurality of sensors can include sensors (231, . . . , 233) illustrated in FIG. 8.

For example, the at least one interface can include a plurality of interfaces configured to receive the plurality of inputs (e.g., 221, . . . , 223) from the plurality of sensors (e.g., 231, . . . , 233) in parallel. A plurality of serial connections can connect the plurality of interfaces to the plurality of sensors (e.g., 231, . . . , 233) respectively.

At block 307, the at least one interface stores, into the random access memory (105) of the device, the third data representative of the plurality of inputs from the plurality of sensors respectively.

At block 309, at least one processing unit (111) of the device (e.g., 101) executes the instructions (e.g., 205) represented by the second data to implement the matrix computations of the artificial neural network (201) having a plurality of first portions and a second portion.

At block 311, the device (e.g., 101) generates first outputs corresponding to the plurality of sensors respectively according to the plurality of the first portions of the artificial neural network (201) by processing the plurality of inputs from the plurality of sensors respectively.

At block 313, the device (e.g., 101) generates a second output according to the second portion of the artificial neural network (201) by processing a combination of the plurality inputs from the plurality of sensors.

For example, an input from each of the plurality of sensors can include image data of a same object; the first outputs include identifications or classifications of the object determined using the plurality of sensors respectively; and the second output includes an identification or classification of the object determined using a combination of the plurality of sensors.

For example, the first portions of the artificial neural network (201) generates the first outputs that include features recognized from the plurality of inputs from the plurality of sensors respectively. The second portion of the artificial neural network (201) generates the second output that includes an identification or classification of the object determined using a combination of the features in the first outputs.

For example, the plurality of sensors can include at least two imaging devices, such as a radar imaging device, a lidar imaging device, an ultrasound imaging device, a digital camera, etc.

Optionally, the integrated circuit device (101) can further include a central process unit configured to execute instructions of an application (235) stored in the random access memory (105). An interface of the device is configured to provide an output of the application (235) generated by the central processing unit (225) based on the outputs (213) of the artificial neural network (201). For example, the output of the application (235) can be provided to a peripheral device, such as a display device, a control element, a computer network, etc.

The present disclosure includes methods and apparatuses which perform the methods described above, including data processing systems which perform these methods, and computer readable media containing instructions which when executed on data processing systems cause the systems to perform these methods.

A typical data processing system may include an interconnect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, Read Only Memory (ROM), Random Access Memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method, comprising:
receiving, in a device, a plurality of inputs from a plurality of sensors respectively;
generating, by the device, a plurality of first outputs corresponding to the plurality of sensors respectively using a plurality of first portions of an artificial neural network by processing the plurality of inputs from the plurality of sensors respectively, wherein each of the first portions is configured to process, in parallel, one of the inputs from one of the sensors; and
generating, by the device, a second output according to a second portion of the artificial neural network by processing a combination of the plurality of inputs from the plurality of sensors, the second portion of the artificial neural network configured to receive the inputs from the sensors, in addition to outputs generated by the first portions, to reduce overlapping processing with the first portions of the artificial neural network.

2. The method of claim 1, wherein the device includes a plurality of interfaces; and the receiving includes receiving the plurality of inputs from the plurality of sensors in parallel via a plurality of serial connections between the plurality of interfaces and the plurality of the sensors respectively.

3. The method of claim 2, further comprising:
writing, to random access memory of the device, instructions of an application;
executing, by a central process unit of the device, the instructions of the application to generate an application output based on at least one output of the artificial neural network; and
communicating, via the plurality of interfaces, the application output to a peripheral device.

4. The method of claim 3, wherein the plurality of sensors includes at least two imaging devices; and the first outputs include features recognized from the plurality of inputs from the plurality of sensors respectively; and the second output includes an identification or classification of an object determined using a combination of the features in the first outputs.

5. The method of claim 4, wherein an input from each of the plurality of sensors includes image data of the object; the first outputs include identifications or classifications of the object determined using the plurality of sensors respectively.

6. A device, comprising:
random access memory;
at least one interface configured to receive a plurality of inputs from a plurality of sensors respectively; and
at least one processing unit coupled with the random access memory and the at least one interface and configured to execute instructions having matrix operands to implement matrix computations of an artificial neural network, the artificial neural network having a plurality of first portions and a second portion, each of the first portions configured to process, in parallel, one of the inputs from one of the sensors, the plurality of the first portions configured to process the plurality of inputs from the plurality of sensors respectively to generate first outputs corresponding to the plurality of sensors respectively, and the second portion configured to receive the inputs from the sensors, in addition to outputs generated by the first portions, to process a combination of the plurality inputs to generate a second output, wherein the second portion of the artificial neural network is configured to reduce overlapping processing with the first portions of the artificial neural network.

7. The device of claim 6, wherein the at least one interface includes a plurality of interfaces configured to receive the plurality of inputs from the plurality of sensors in parallel.

8. The device of claim 7, wherein the plurality of interfaces are configured to be connected to the plurality of sensors via a plurality of serial connections respectively.

9. The device of claim 8, wherein an input from each of the plurality of sensors includes image data of an object; the first outputs include identifications or classifications of the object determined using the plurality of sensors respectively; and the second output includes an identification or classification of the object determined using a combination of the plurality of sensors.

10. The device of claim 8, wherein the first outputs include features recognized from the plurality of inputs from the plurality of sensors respectively; and the second output includes an identification or classification of an object determined using a combination of the features in the first outputs.

11. The device of claim 8, wherein the plurality of sensors includes at least two imaging devices.

12. The device of claim 8, further comprising:
a central process unit configured to execute instructions of an application stored in the random access memory.

13. The device of claim 12, further comprising:
an interface configured to provide an output of the application generated by the central processing unit based on the second output of the artificial neural network.

14. The device of claim 13, further comprising:
an integrated circuit die of a field-programmable gate array or application specific integrated circuit implementing a deep learning accelerator, the deep learning accelerator comprising the at least one processing unit, and a control unit configured to load instructions from the random access memory for execution.

15. The device of claim 14, wherein the at least one processing unit includes a matrix-matrix unit configured to operate on two matrix operands of an instruction;

wherein the matrix-matrix unit includes a plurality of matrix-vector units configured to operate in parallel;

wherein each of the plurality of matrix-vector units includes a plurality of vector-vector units configured to operate in parallel; and wherein each of the plurality of vector-vector units includes a plurality of multiply-accumulate units configured to operate in parallel.

16. The device of claim 15, wherein the random access memory and the deep learning accelerator are formed on separate integrated circuit dies and connected by through-silicon vias; and the device further comprises:

an integrated circuit package configured to enclose at least the random access memory and the deep learning accelerator.

17. An apparatus, comprising:

memory configured to store first data representative of parameters of an artificial neural network, second data representative of instructions executable to implement matrix computations of the artificial neural network using at least the first data stored in the memory, and third data representative of a plurality of inputs from a plurality of sensors respectively;

at least one interface configured to receive the third data representative of the plurality of inputs from the plurality of sensors respectively and store the third data into the memory;

a connection to the memory; and a field-programmable gate array or application specific integrated circuit having:

a memory interface configured to access the memory via the connection; and at least one processing unit configured to execute the instructions having matrix operands to implement the matrix computations of the artificial neural network, the artificial neural network having a plurality of first portions and a second portion, each of the first portions configured to process, in parallel, one of the inputs from one of the sensors, the plurality of the first portions configured to process the plurality of inputs from the plurality of sensors respectively to generate first outputs corresponding to the plurality of sensors respectively, and the second portion configured to receive the inputs from the sensors, in addition to outputs generated by the first portions, to process a combination of the plurality inputs to generate a second output.

18. The apparatus of claim 17, wherein the at least one interface is configured to access the memory via the memory interface of the field-programmable gate array or application specific integrated circuit and the connection to the memory.

19. The apparatus of claim 18, further comprising:

a central process unit configured to execute instructions of an application stored in the memory, the central process unit configured to access the memory via the memory interface of the field-programmable gate array or application specific integrated circuit and the connection to the memory.

20. The apparatus of claim 19, further comprising:

the plurality of sensors including at least two imaging devices, wherein the second output includes an identification or classification of an object captured in images generated by the at least two imaging devices.

\* \* \* \* \*